(12) United States Patent
Whiting et al.

(10) Patent No.: US 8,872,224 B2
(45) Date of Patent: Oct. 28, 2014

(54) SOLUTION PROCESSED NEUTRON DETECTOR

(71) Applicant: Palo Alto Research Center Incorporated, Palo Alto, CA (US)

(72) Inventors: Gregory L. Whiting, Menlo Park, CA (US); Tse Nga Ng, Palo Alto, CA (US); Janos Veres, San Jose, CA (US); Robert A. Street, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 13/831,442

(22) Filed: Mar. 14, 2013

(65) Prior Publication Data

US 2014/0264436 A1    Sep. 18, 2014

(51) Int. Cl.
*H01L 29/66*     (2006.01)
*H01L 31/115*    (2006.01)
*H01L 31/18*     (2006.01)
*H01L 31/0336*   (2006.01)

(52) U.S. Cl.
CPC ............ *H01L 31/18* (2013.01); *H01L 31/0336* (2013.01)
USPC .......................................... 257/183; 257/429

(58) Field of Classification Search
CPC ...................... H01L 27/14609; H01L 27/1462; H01L 27/14676; H01L 31/118; H01L 31/115
USPC .......... 257/183, 659, 428, E51.012, 429, 458, 257/459, 77, 444, 435, 258, 225, 53, 56; 438/99, 758, 56; 250/214.1, 366, 250/370.05–13, 307, 382, 390.11
See application file for complete search history.

(56) References Cited

U.S. PATENT DOCUMENTS

| | | | |
|---|---|---|---|
| 7,799,371 B2 | 9/2010 | Fork et al. | |
| 8,283,655 B2 | 10/2012 | Chabinyc et al. | |
| 2008/0128628 A1* | 6/2008 | Moses et al. | 250/370.05 |
| 2009/0072141 A1* | 3/2009 | Satoh et al. | 250/336.2 |
| 2011/0049379 A1* | 3/2011 | Moses | 250/390.01 |
| 2013/0193537 A1* | 8/2013 | Hossain et al. | 257/429 |
| 2013/0267056 A1* | 10/2013 | Fushie et al. | 438/56 |

OTHER PUBLICATIONS

Design of a silicon carbide neutron sensor. Hu, Qing-Qing; Yang, Jun; Liu, GuoFu; Luo, Xiao-liang. Eighth International Symposium on Precision Engineering Measurement and Instrumentation. Proceedings of the SPIE, vol. 8759, article id. 87591G, 6 pp. (2013). Publication Date: Jan. 2013.*

(Continued)

*Primary Examiner* — Yuanda Zhang
*Assistant Examiner* — Sheikh Maruf
(74) *Attorney, Agent, or Firm* — Bever, Hoffman & Harms, LLP; Patrick T. Bever (57) ABSTRACT

A low-cost neutron detector is formed on a substrate includes a sensor formed by an active material layer sandwiched between two electrodes, and a neutron capture layer formed in close proximity to (i.e., over and/or under) the sensor. The sensor active material layer includes a bulk heterojunction or bilayer structure that is formed by depositing particulate solutions incorporating at least one type of high atomic number nanoparticle using low-temperature (i.e., below 400° C.) solution processing techniques. The sensor electrode material and neutron capture material are similarly disposed in associated solutions (e.g., conductive inks) that are also deposited using low-temperature solution processing techniques, whereby the fabrication process can be carried out on low-cost flexible substrate material (e.g., PET) using high efficiency roll-to-roll production techniques. The neutron capture material is optionally patterned as an array of pillars, and the active layer materials are backfilled between the pillars.

20 Claims, 6 Drawing Sheets

(56) References Cited

OTHER PUBLICATIONS

Ambrosi, R. M. et al. "X-ray tests of a microchannel plate detector and amorphous silicon pixel array readout for neutron radiography", Nuclear Instruments and Methods in Physics Research A 572 (2007), pp. 844-852.

Gur, Ilan et al. "Air stable all-inorganic nanocrystal solar cells processed from solution", Science 310, Oct. 21, 2005, pp. 462-465.

Nikolic, R. et al. "Boron Based Thermal Neutron Detectors: Possibilities and Progress", Abstract of presentation from 2010 MRS Fall Meeting, Boston, MA, Nov. 29-Dec. 3, 2010, 2 pages.

* cited by examiner

SOLUTION PROCESSED NEUTRON DETECTOR

FIELD OF THE INVENTION

This invention relates to neutron detectors, and more particular to low-cost neutron detectors formed using low-cost production methods.

BACKGROUND OF THE INVENTION

Neutron detectors are devices for detecting the presence of thermal neutrons, which are free neutrons (i.e., not bound within an atomic nucleus) that are generated in relatively large numbers by certain hazardous materials (e.g., materials that can be used to produce nuclear weapons). As such, neutron detectors are typically used to detect the presence of hazardous materials by identifying an unusually high number of thermal neutrons in the environment surrounding the hazardous materials.

Because neutrons carry no electrical charge, neutron detection requires the use of a "neutron capture" material (i.e., a material with a high neutron capture cross-section) that "converts" neutrons into charged particles that can then be detected using an electrical sensor. This conversion process typically involves an absorptive reaction in which neutrons are absorbed by the neutron capture material, which then react to the absorption event by emitting high energy ionized particles. Conventional neutron capture materials include Helium-3, Lithium-6, Boron-10 and Uranium-235.

Early tube-type neutron detectors typically use Helium-3 gas as a neutron capture material, and can achieve very high thermal neutron detection efficiencies (e.g., a 2" diameter tube filled with 10 atm $He^3$ gas are capable of approximately 80% detection efficiency). However, tube-type neutron detectors are expensive to produce, and for various reasons (e.g., gas leakage), are normally operated at lower gas pressures, which greatly reduces the detector efficiency.

More recently, solid-state semiconductor-based neutron detectors have been developed that typically operate by coating a silicon photodiode structure (p-n junction) with a solid material having high neutron capture cross-section, such as Boron-10. Incident neutrons are converted to ionizing radiation (alpha particles) in the boron-10 layer, which in turn generate electron-hole pairs in the silicon that are separated and collected by the p-n junction. A problem with such conventional solid-state neutron detectors is that the vapor deposited silicon layers used to produce conventional solid state neutron detectors require expensive semiconductor processing techniques.

What is needed is a bulk manufacturing method for producing low-cost neutron detectors that can be utilized in certain applications, such as distributed item level tagging of packages during shipping to detect hazardous radioactive materials.

SUMMARY OF THE INVENTION

The present invention is directed to a neutron detector including both a sensor and a neutron capture layer disposed on a base substrate. The sensor includes a planar lower (first) electrode and a planar upper (second) electrode that are disposed parallel to the substrate's upper surface, with an active material layer sandwiched between the two electrodes. The neutron capture layer is formed on, under or around the sensor and includes a sufficient amount of a neutron capture material (e.g., a layer of $B^{10}$ ranging in thickness from 0.5 to 10 microns) to capture and convert neutrons into charged particles (i.e., ionizing radiation) that are directed into the sensor. According to an aspect of the present invention, the active material layer includes a donor material and an acceptor material that are operably formed, such as by solution coating, and matched such that at least some of the charged particles generated by the neutron capture material are converted to electron-hole pairs at donor/acceptor interfaces, whereby the holes and electrons are respectively conducted by the donor and acceptor materials to the electrodes. The amount of charge generated by the electrons and holes collected on the electrodes is measured, for example, by an external meter to determine ambient thermal neutron density.

According to another aspect of the invention, the photoactive material layer is comprised of donor and acceptor materials where at least one of these materials includes high atomic number metal semiconductor nanoparticles, such as Cadmium-Selenide, Cadmium-Telluride (CdTe), lead sulfide (PbS) or other metal chalcogenides. The present inventors have determined that active layers formed by elements having low atomic numbers (such as carbon or silicon) are inadequate for use in solution-processed neutron detection. By forming the sensor's active layer using a bulk heterojunction solution containing nanoparticles comprised of high atomic number elements, a highly efficient sensor having a thickness in the range of 500 nm and 10 microns can be provided, thereby facilitating the production of highly reliable, low-cost, solution processed sensor structures that operates similar to a photodiode, but provides much higher sensitivity to detect the types of charged particles produced by captured neutrons.

According to another embodiment of the present invention, a low-cost method is provided for producing neutron detectors on a flexible substrate (e.g., Polyethylene naphthalate (PEN), Polyethylene terephthalate (PET), polyimide, or stainless steel foil) using low-temperature (i.e., below 400° C.) solution processing techniques, thereby facilitating the use of high volume (e.g., roll-to-roll) manufacturing processes. The method involves forming both a sensor and neutron capture layer by depositing various solutions (e.g., inks, pastes or other liquid or semi-liquid materials) on the flexible substrate using a series of solution deposition processes, such as ink-jet printing, gravure printing, screen printing, extrusion printing, spin coating, drop coating and dip coating, all being performed below 400° C. In one example, the sensor is formed directly on the flexible substrate, and then the neutron capture layer is formed on top of the sensor. The sensor formation begins by depositing a first conductive solution (e.g., a liquid ink including silver, copper, gold, or a conducting polymer) in a predetermined pattern such that the printed or otherwise deposited solution forms a first electrode of the sensor. The sensor's active material layer is then formed by depositing at least one active material solution containing semiconductor nanoparticles over the first electrode such that the active material solution forms a junction structure including a donor material and an acceptor material that define at least one interface boundary. The sensor formation is then completed by depositing a second conductive solution (e.g., a second ink having a composition different from the first ink) such that second conductive solution forms a second electrode on top of the active material layer. The neutron capture layer is then formed on the sensor by depositing a particulate solution containing a neutron capture material (e.g., Boron-10) such that, after annealing, the residual material forms a layer having a suitable nominal thickness (e.g., 1.6 microns). The present invention utilizes low-temperature solution processing for the fabrication of neutron detectors facilitates highly efficient roll-to-roll production on low-cost flexible base substrates (e.g., PET or PEN). The low-temperature solution processing used in accordance with the present invention is facilitated by utilizing solution-processable particulate solutions composed of nanoparticle elements with high atomic number that form low-cost, highly efficient sensor active layers capable of detecting ionizing radiation generated by the neutron capturing material.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in low-cost neutron detection. The following description is presented to enable one of ordinary skill in the art to make and use the invention as provided in the context of a particular application and its requirements. As used herein, directional terms such as "upper", "lower" and "side" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
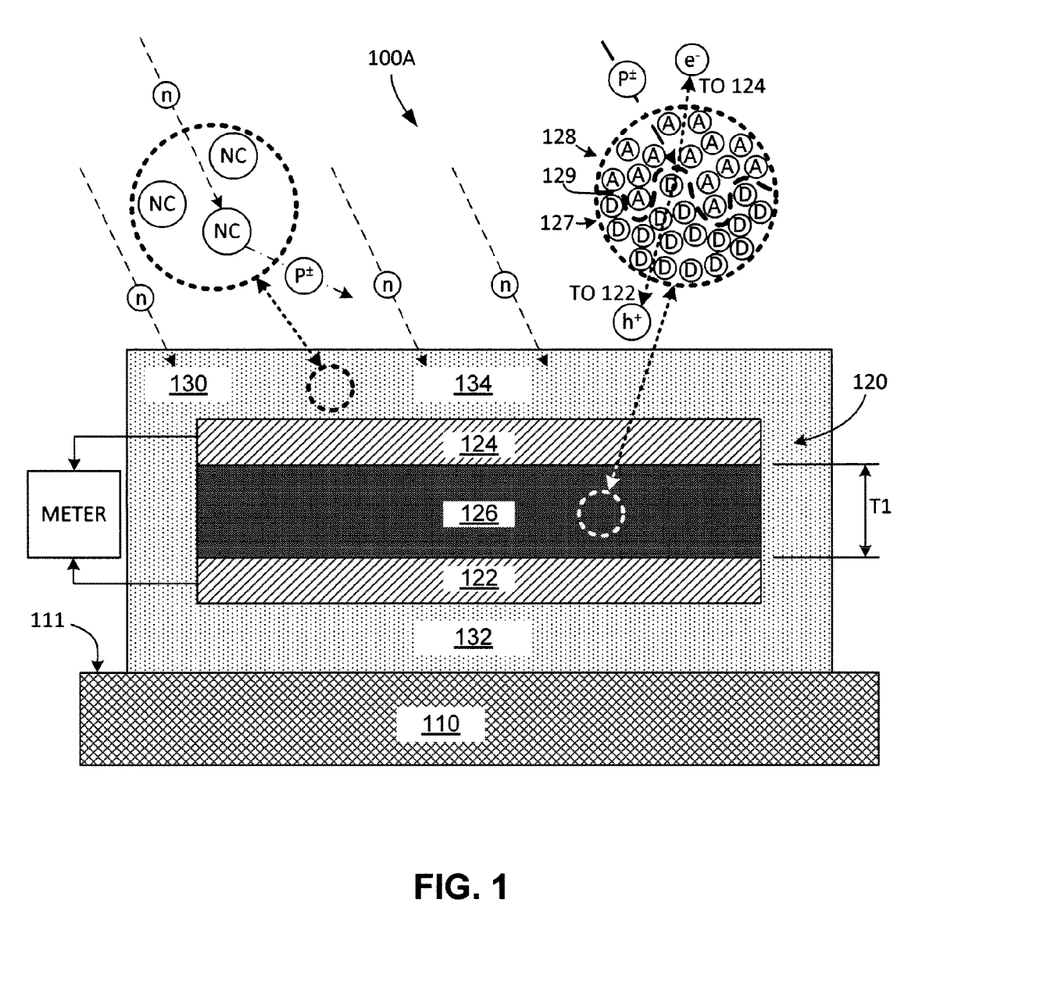
FIG. 1 is a side view showing a simplified neutron detector according to an embodiment of the present invention.

FIG. 1 shows a neutron detector 100A according to a simplified exemplary embodiment including both a sensor 120 and a neutron capture layer 130 disposed on a base substrate 110.

As indicated by the dashed-line circle located in the upper left portion of FIG. 1, neutron capture layer 130 includes a neutron capture material NC that is capable of capturing thermal neutrons "n" directed onto neutron detector 100A, and converting the captured thermal neutrons into a charged particles $P^\pm$ (i.e., ionizing radiation) that are emitted in random directions, at least some of which being directed into sensor 120. In a presently preferred embodiment, neutron capture material 130 comprises Boron-10, but in alternative embodiments may comprise Lithium-6, Gadolinium-157 or Uranium-235. Neutron capture layer 130 is formed on, under or around the sensor and includes a sufficient amount of a neutron capture material to capture at least 5% of thermal neutrons directed onto the neutron detector (e.g., a layer of $B^{10}$ having a thickness in the range of 0.5 and 10 μm). In an exemplary embodiment, neutron capture layer 130 includes a lower layer portion 132 disposed under sensor 120 and an upper layer portion 134 disposed over sensor 120, this arrangement being provided to maximize the number of charged particles $P^\pm$ entering sensor 120.

Sensor 120 includes a planar (flat) lower electrode 122 and a planar upper electrode 124 that are disposed parallel to the substrate's upper surface 111, and an active material layer 126 sandwiched between electrodes 122 and 124. As indicated in the dashed-line circle located in the upper right portion of FIG. 1, according to an aspect of the present invention, active material layer 126 includes "donor" (lower) material groups 127 consisting essentially of a donor material D, and "acceptor" (upper) material groups 128 consisting essentially of an acceptor material A. Donor material D and acceptor material A are operably disposed and matched such that at least some of the charged particles $P^\pm$ generated by neutron capture layer 130 are converted to electron-hole pairs ("e−" and "h+") at an interface 129 defined between donor group 127 and acceptor group 128, with the holes "h+" being transferred by hole hopping through donor group 127 to lower electrode 122, and the electrons being transferred by electron hopping through acceptor group 128 to upper electrode 124. In alternative embodiments, the donor and acceptor materials of active material layer 126 are arranged in a heterojunction structure where the donor and acceptor materials are blended together to form multiple distributed interfaces 129, or arranged in a bilayer structure in which the donor and acceptor materials form two layers having a single interface 129 (e.g., as illustrated in the bubble in FIG. 1). The amount of charge generated by the electrons and holes collected on the electrodes is measured, for example, by an external meter (shown on the left side of FIG. 1) to determine ambient thermal neutron density.

According to another aspect of the invention, one or both of the donor and acceptor materials of active material layer 126 comprises nanoparticles, and more preferably high atomic number semiconductor nanoparticles. As used herein the phrase "high atomic number nanoparticles" refers to nanoparticles that consist essentially of elements having an atomic number greater than 14. In an exemplary embodiment, the donor material D includes nanoparticles comprising Cadmium Telluride (CdTe) or organic semiconductors such as poly(3-hexylthiophene) (P3HT), and the acceptor material A includes a semiconductor nanoparticle such as Cadmium Selenide (CdSe) or an organic semiconductor such as perylene-based materials, or includes an inorganic particulate material or a soluble organic material such as a semiconducting polymer. The present inventors have determined that active material layers formed by elements having low atomic numbers (such as carbon or silicon are inadequate for use in solution-processed neutron detection. By forming sensor 120 with active material layer 126 formed as a bulk heterojunction (or bilayer) structure containing high atomic number nanoparticles, a highly efficient sensor can be provided, thereby facilitating the production of highly reliable, low-cost sensor structures that operates similar to a photodiode, but provides much higher sensitivity to detect the types of charged particles produced by captured neutrons, and in particular enables solution-processing of the device.

FIGS. 2(A) to 2(E) illustrate an exemplary method for producing neutron detectors according to another embodiment of the present invention, where the use of various particulate solutions (e.g., inks, pastes or other liquid or semi-liquid materials) and low-temperature solution processing techniques facilitates the high-volume production of neutron detectors on low-cost flexible substrates, which in turn facilitates the use of low-cost, high volume (e.g., roll-to-roll) manufacturing processes. The method described below is specifically directed to the production of a neutron detector 100B (shown in FIG. 2(E)) in which first electrode 122 is disposed directly on upper surface 111 of base substrate 110, and then neutron capture layer 130 is formed over sensor 120 such that sensor 120 is entirely disposed between at least a portion of neutron capture layer 130 and substrate 110, but the methodology described below is easily modified to produce other neutron detector types, such as neutron detector 100A (FIG. 1).

Figure 2A:
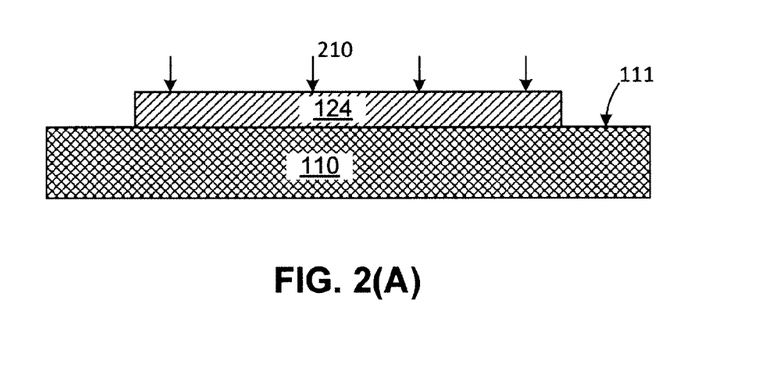
FIGS. 2(A), 2(B), 2(C), 2(D) and 2(E) are side views showing an exemplary method for fabricating a neutron detector according to a second embodiment of the present invention.

FIG. 2(A) depicts the initial production process in which a first conductive solution 210 (e.g., a liquid ink including silver, copper, gold, or a conducting polymer) is deposited on upper substrate surface 111 in a predetermined pattern using a selected solution processing technique such that the printed or otherwise patterned solution dries or otherwise solidifies to form a lower (first) electrode 122.

Figure 2B:
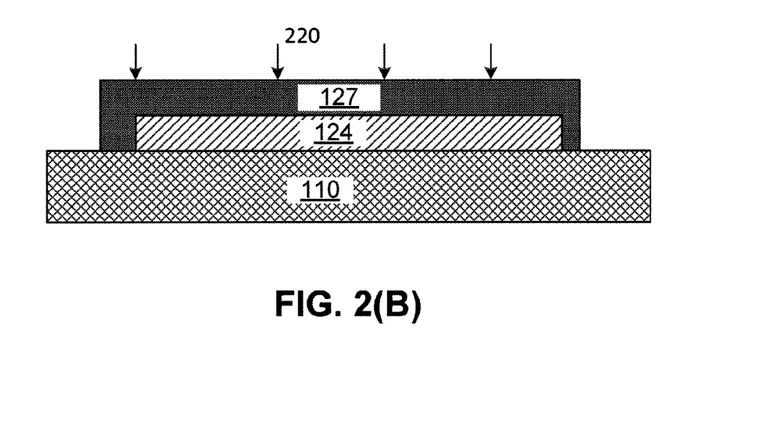
Figure 2C:
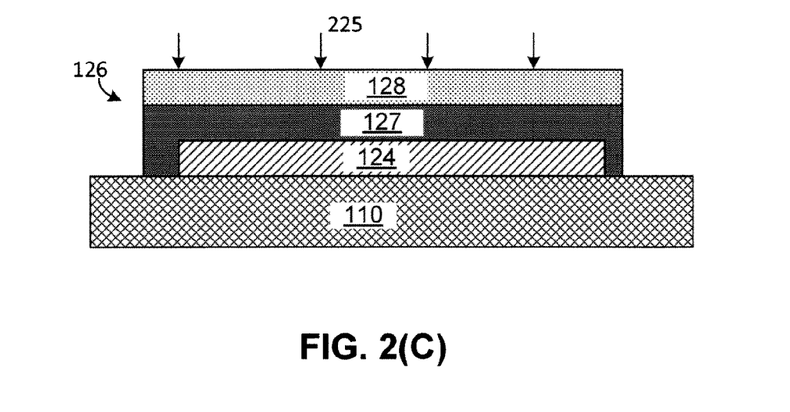

FIGS. 2(B) and 2(C) depict the formation of active material layer 126 in the form of a heterojunction structure according to an exemplary embodiment, which is formed on first electrode 122 by depositing two or more active material solutions, wherein at least one of said active material solutions includes a large number of high atomic number nanoparticles, which is defined above. Referring to FIG. 2(B), the exemplary sensor formation process specifically includes depositing a first active material solution 220, for example CdTe nanoparticles. Referring to FIG. 2(C), a second active material solution 225 is then deposited that includes an acceptor material, wherein in one embodiment solution 225 includes one of an inorganic particulate material such as CdSe nanoparticles. Active material solutions 220 and 225 are deposited and processed such that donor and acceptor materials form a heterojunction structure that define suitable interface boundaries, for example, utilizing methods disclosed in co-owned U.S. Pat. No. 8,283, 655, which is incorporated herein by reference in its entirety. Alternatively, rather than subsequent deposition of donor and acceptor materials, a blend of donor and acceptor materials (such as P3HT and CdSe nanoparticles) can be deposited as the active layer.

Figure 2D:
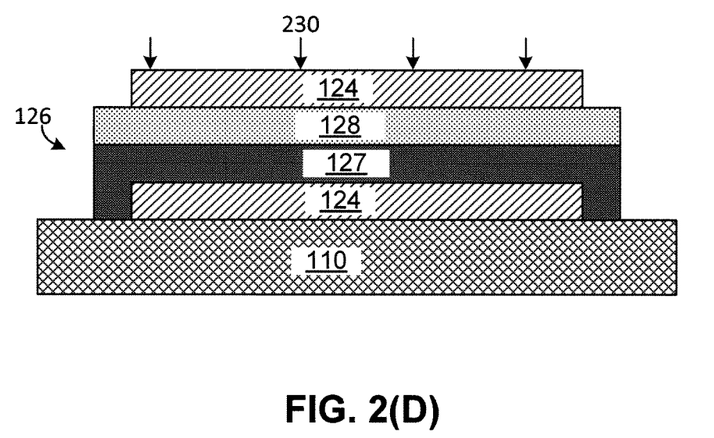

FIG. 2(D) depicts the formation of a second electrode 124 by depositing a second conductive solution (ink) 220 on the active material structure 126, thereby completing the formation of sensor 120. Similar to conductive solution 210, second conductive solution 220 includes a conductive material in particulate form disposed in a suitable liquid solvent. However, the (second) conductive material in second conductive solution 220 is preferably different from the conductive material of conductive solution 210 because the conductive materials should match the work function for n- or p-carrier extraction.

Figure 2E:
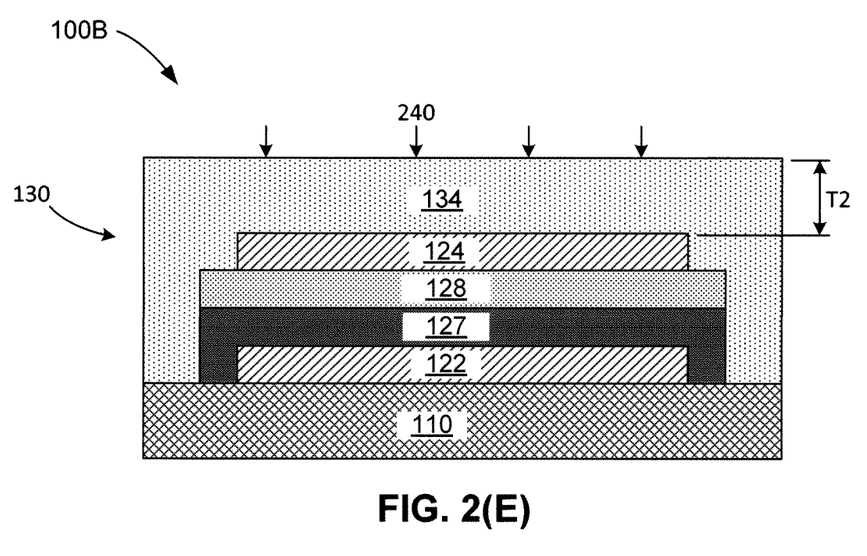

FIG. 2(E) shows a subsequent process of the method in which a particulate solution 240 is deposited over substrate 110. As set forth above, particulate solution 240 contains a neutron capture material (e.g., Boron-10), and a sufficient amount of particulate solution 240 is deposited to form neutron capture layer 130 with a portion 134 having a thickness T2 in the range of 0.5 and 3 microns (preferably 1.6 microns), which is sufficient to capture and convert at least 5% of thermal neutrons directed onto neutron detector 100E into corresponding charged particles.

Figure 5:
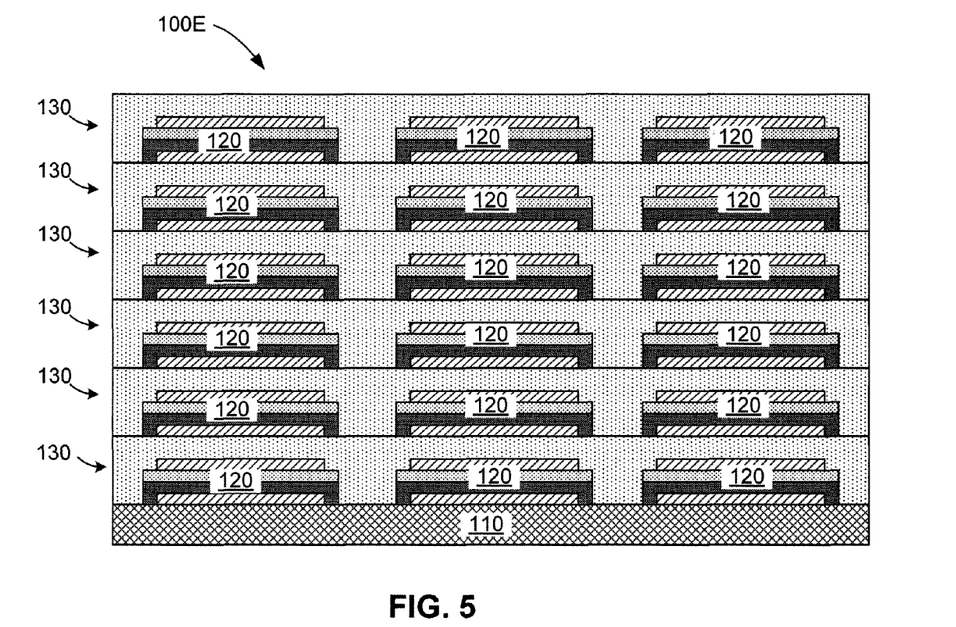
FIG. 5 is side view showing a simplified neutron detector according to a fifth embodiment of the present invention.

Various additional processes (not shown) are performed as needed during the exemplary fabrication process illustrated in FIGS. 2(A) to 2(E). For example, various annealing processes are utilized as needed, for example, before depositing active material solution 220 (e.g., to remove solutes from conductive ink 210), before depositing active material solution 225 (e.g., to remove solutes from active material solution 220), before depositing conductive solution 230, and before depositing particulate solution 240. Other optional processes include patterning individual pixel boundaries as shown in FIG. 5.

The neutron detector fabrication method described above is characterized in that all of electrodes 122 and 124, active material structure 126 and neutron capture layer 130 are formed by depositing associated solutions (i.e., all of conductive solutions 210 and 220, active material solutions 220 and 225, and particulate solution 240) using one or more solution processing technique (e.g., one of ink-jet printing, gravure printing, screen printing, extrusion printing, spin coating, drop coating and dip coating) that are entirely conducted (performed) at low temperatures (i.e., below 400° C.). The low-temperature solution processing used in accordance with the present invention is facilitated by utilizing one or more solution-processable active material solutions including nanoparticle elements having a high atomic number. Because the processes are entirely carried out at low temperatures, the present invention facilitates the use of highly efficient roll-to-roll production methods in which the neutron detectors of the present invention are fabricated in high production volumes on low-cost flexible base substrates (e.g., PET or PEN).

Figure 3:
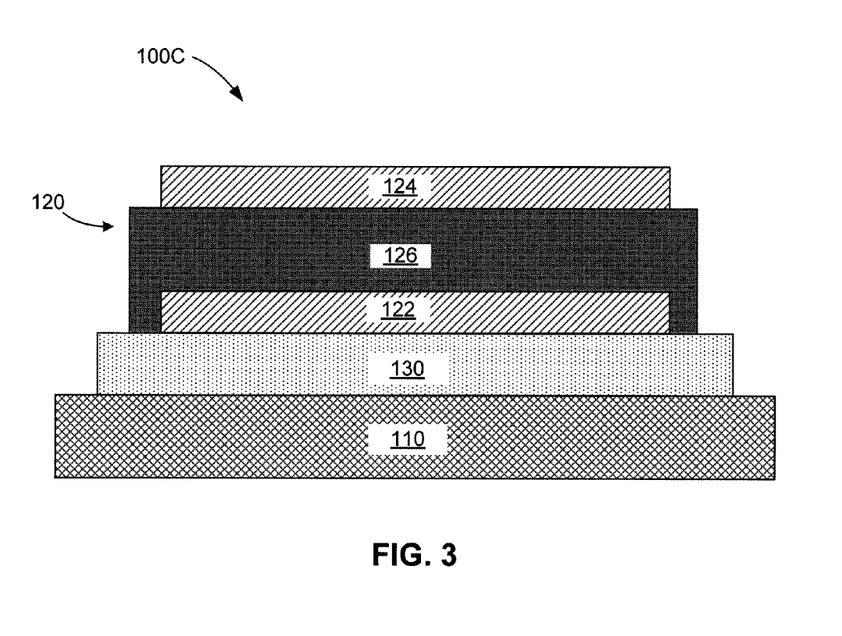
FIG. 3 is side view showing a simplified neutron detector according to a third embodiment of the present invention.

The order in which the various processes depicted in FIGS. 2(A) to 2(E) are performed may be altered to produce different neutron detector structures that function in the manner described herein. Specifically, the relative position of sensor 120 and neutron capture layer 130 (i.e., the order in which the sensor and neutron detector layer are fabricated on the substrate) may be altered according to various alterative embodiments. For example, referring to FIG. 1, the fabrication process associated with neutron detector 100A includes the deposition of a first portion 132 of neutron capture layer 130 prior to the formation of sensor 120 (i.e., such that first electrode 122 is formed on first portion 132 of neutron capture layer 130, instead of being formed on upper substrate surface 111 as shown in FIG. 2(A)). FIG. 3 shows a neutron detector 100C that differs from the previous embodiments in that the formation of neutron capture layer 130 is entirely performed before forming sensor 120 (i.e., such that neutron capture layer is entirely formed on base substrate 110, lower electrode 122 is formed on an upper surface of neutron capture layer 130, and then active material layer 126 and upper electrode 124 are formed, respectively, as described above).

The various specific processes described above may also be modified while remaining within the spirit and scope of the present invention.

Figure 4A:
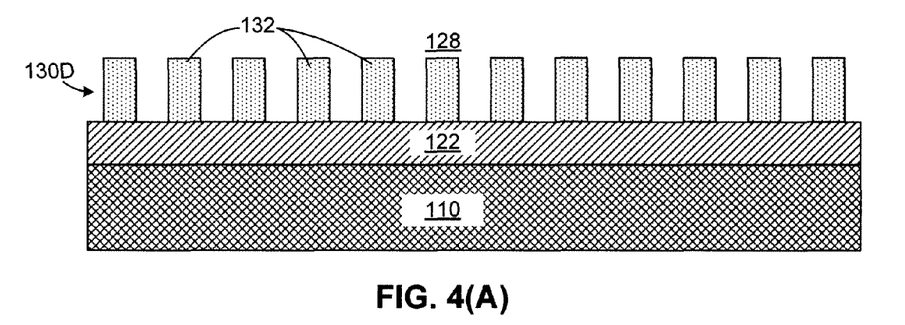
FIGS. 4(A), 4(B) and 4(C) are side views showing a method for producing a simplified neutron detector according to a fourth embodiment of the present invention
Figure 4B:
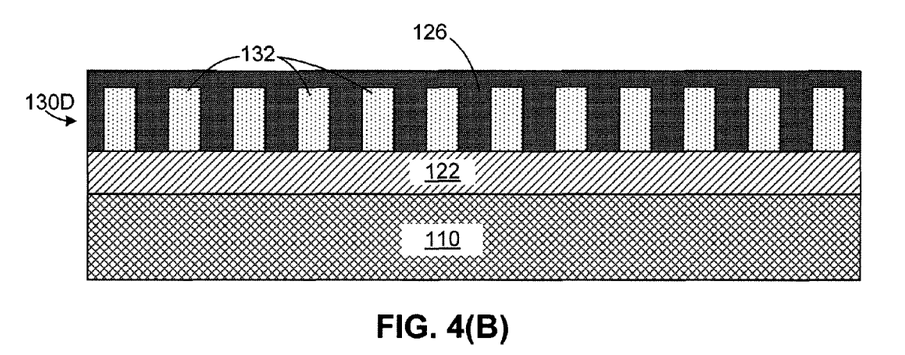
Figure 4C:
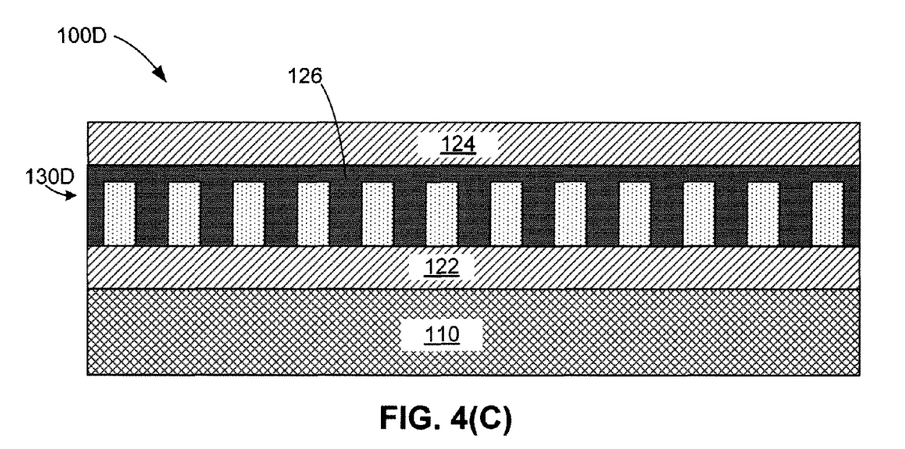

For example, FIGS. 4(A) to 4(C) depict the formation of a neutron detector 100D in which the neutron capture layer 130 is incorporated into the sensor (i.e., disposed between the upper and lower electrodes). Referring to FIG. 4(A), lower electrode 122 is formed on base substrate 110 as described above. Neutron capture layer 130D is then formed by depositing a neutron capture material (e.g., Boron-10), and then patterning the neutron capture material using known techniques such as photolithography, printing, or stamping, to form an array of spaced-apart neutron capture material pillars 132. As indicated in FIG. 4(B), active material layer 126 is then formed by depositing the associated solutions onto pillars 132 (i.e., such that the active material backfills the spaces between pillars 132). As indicated in FIG. 4(C), neutron detector 100D is then completed by forming upper electrode 124 on the upper surface of active material layer 126. By forming neutron capture layer 130D such that the neutron capture material is formed as an array of pillars, neutron detector 100D provides an increased neutron absorption surface area over the planar structures utilized in other embodiments.

In another embodiment (not shown), the neutron capture material is formed as a series of elongated ribs in close contact with the active material layer by co-extruding the neutron capture material with at least one of the active material solutions using co-extrusion methods similar to those described in co-owned U.S. Pat. No. 7,799,371, which is incorporated herein by reference in its entirety.

Figure 6:
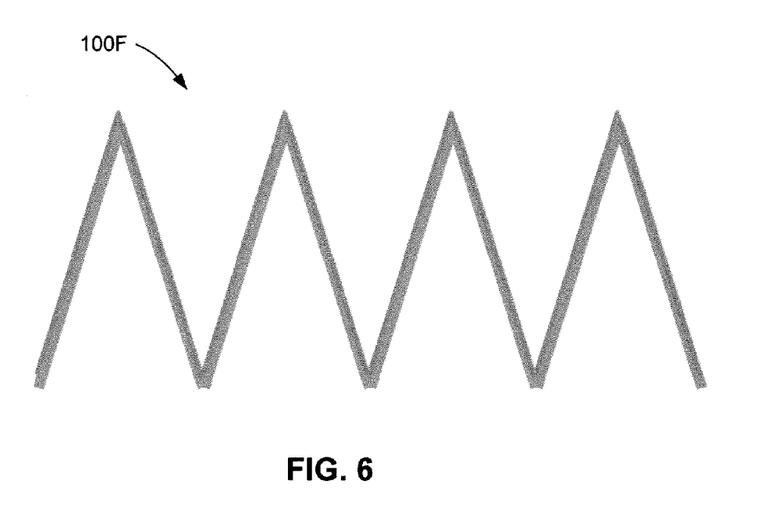
FIG. 6 is side view showing a simplified neutron detector according to a sixth embodiment of the present invention.

The various sensors described above may be stacked or otherwise arranged to increase their ability to capture neutrons. That is, the mean-free-path of an alpha particle in Boron is about 2 microns, so the Boron layer must be sufficiently thin (e.g., in the range of 0.5 microns to 3 microns) in order for the alpha particle to escape with any appreciable energy to produce a signal in the sensor. On the other hand, the mean-free path of a thermal neutron in boron-10 is about 20 microns, so the probability of stopping a neutron in a 2 micron thick layer of Boron is small; approximately 10%. To overcome this disparity, according to another embodiment of the present invention shown in FIG. 5, neutron detector 100E is composed of multiple neutron capture layers 130 and associated sensors 120 disposed in a stacked arrangement on one or more substrates 110 to facilitate high sensitivity. Alternatively, as indicated in FIG. 6, neutron detector 100F includes any of the sensor arrangements described above, but disposed in a folded arrangement to provide a larger cross-section for neutron absorption without increasing the thickness of the layers.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A neutron detector comprising:
   a substrate having an upper substrate surface;
   a sensor disposed on the upper substrate surface, the sensor including a first electrode and a second electrode disposed parallel to the upper substrate surface, and an active material layer sandwiched between the first and second electrodes; and
   a neutron capture layer disposed on the substrate and contacting the sensor, said neutron capture layer including a neutron capture material for capturing thermal neutrons directed onto the neutron detector and for converting each said captured thermal neutron into a charged particle,
   wherein the active material layer comprises a donor material and an acceptor material operably formulated and arranged to convert said charged particles into electron-hole pairs, and to separate and transport the electrons-holes to the first and second electrodes,
   wherein at least one of the donor material and the acceptor material comprises nanoparticles, and
   wherein the first electrode is disposed directly on the upper substrate surface such that the sensor is disposed between at least a portion of the neutron capture layer and the substrate.

2. The neutron detector of claim 1,
   wherein nanoparticles of the active material layer consist essentially of a metal chalcogenide, and
   wherein the active material layer further comprises one of an inorganic particulate material and a soluble organic material.

3. The neutron detector of claim 1, wherein the active material layer has a thickness in the range of 500 nm to 10 microns.

4. The neutron detector of claim 1, wherein the substrate comprises a flexible material including at least one of PEN, PET, polyimide and stainless steel foil.

5. The neutron detector of claim 1, wherein each of the first and second electrodes comprise one of silver, copper, gold, and a conducting polymer.

6. The neutron detector of claim 1,
   wherein the first electrode comprises a first conductive material,
   wherein the second electrode comprises a second conductive material, and
   wherein the first conductive material is different from the second conductive material.

7. The neutron detector of claim 1, wherein the neutron capture layer comprises one of Boron-10 ($B^{10}$), Lithium-6, Gadolinium-157 and Uranium-235.

8. The neutron detector of claim 1, wherein the neutron capture layer has a thickness in the range of 0.5 microns and 10 microns.

9. A neutron detector comprising:
   a substrate having an upper substrate surface;
   a sensor disposed on the upper substrate surface, the sensor including a first electrode and a second electrode disposed parallel to the upper substrate surface, and an active material layer sandwiched between the first and second electrodes; and
   a neutron capture layer disposed on the substrate and contacting the sensor, said neutron capture layer including a neutron capture material for capturing thermal neutrons directed onto the neutron detector and for converting each said captured thermal neutron into a charged particle,
   wherein the active material layer comprises a donor material and an acceptor material operably formulated and arranged to convert said charged particles into electron-hole pairs, and to separate and transport the electrons-holes to the first and second electrodes,
   wherein at least one of the donor material and the acceptor material comprises nanoparticles, and
   wherein at least a portion of the neutron capture layer is disposed between the sensor and the substrate such that the first electrode is disposed on said portion of the neutron capture layer.

10. A neutron detector comprising:
    a substrate having an upper substrate surface;
    a sensor disposed on the upper substrate surface, the sensor including a first electrode and a second electrode disposed parallel to the upper substrate surface, and an active material layer sandwiched between the first and second electrodes; and
    a neutron capture layer disposed on the substrate and contacting the sensor, said neutron capture layer including a neutron capture material for capturing thermal neutrons directed onto the neutron detector and for converting each said captured thermal neutron into a charged particle,
    wherein the active material layer comprises a donor material and an acceptor material operably formulated and arranged to convert said charged particles into electron-hole pairs, and to separate and transport the electrons-holes to the first and second electrodes,
    wherein at least one of the donor material and the acceptor material comprises nanoparticles, and wherein the neutron capture layer is patterned include a plurality of pillars, and wherein the active material layer is disposed between said pillars.

11. The neutron detector of claim 9, wherein nanoparticles of the active material layer consist essentially of one of a metal chalcogenide, and wherein the active material layer further comprises one of an inorganic particulate material and a soluble organic material.

12. The neutron detector of claim 9, wherein the active material layer has a thickness in the range of 500 nm to 10 microns.

13. The neutron detector of claim 9, wherein the substrate comprises a flexible material including at least one of PEN, PET, polyimide and stainless steel foil.

14. The neutron detector of claim 9, wherein each of the first and second electrodes comprise one of silver, copper, gold, and a conducting polymer.

15. The neutron detector of claim 9, wherein the first electrode comprises a first conductive material, wherein the second electrode comprises a second conductive material, and wherein the first conductive material is different from the second conductive material.

16. The neutron detector of claim 9, wherein the neutron capture layer comprises one of Boron-10 ($B^{10}$), Lithium-6, Gadolinium-157 and Uranium-235.

17. The neutron detector of claim 9, wherein the neutron capture layer has a thickness in the range of 0.5 microns and 10 microns.

18. The neutron detector of claim 10, wherein nanoparticles of the active material layer consist essentially of one of Cadmium-Selenide, Cadmium-Tellurie, and a metal chalcogenide, and wherein the active material layer further comprises one of an inorganic particulate material and a soluble organic material.

19. The neutron detector of claim 10, wherein the substrate comprises a flexible material including at least one of PEN, PET, polyimide and stainless steel foil.

20. The neutron detector of claim 10, wherein each of the first and second electrodes comprise one of silver, copper, gold, and a conducting polymer.

\* \* \* \* \*